(12) United States Patent
Chen et al.

(10) Patent No.: US 6,980,456 B2
(45) Date of Patent: Dec. 27, 2005

(54) MEMORY WITH LOW AND FIXED PRE-CHARGE LOADING

(75) Inventors: Chung-Kuang Chen, Panchiao (TW); Hsiang-Pang Li, Jungli (TW)

(73) Assignee: Macronix International Co., Ltd., (TW)

( * ) Notice: Subject to any disclaimer, the term of this patent is extended or adjusted under 35 U.S.C. 154(b) by 0 days.

(21) Appl. No.: 10/794,048

(22) Filed: Mar. 8, 2004

(65) Prior Publication Data

US 2005/0195668 A1   Sep. 8, 2005

(51) Int. Cl.$^7$ ............................................. G11C 17/00
(52) U.S. Cl. ......................... 365/104; 365/94; 257/390
(58) Field of Search ...................... 365/94, 104, 63; 257/390

(56) References Cited

U.S. PATENT DOCUMENTS

| | | | | |
|---|---|---|---|---|
| 5,650,959 A | * | 7/1997 | Hayashi et al. | 365/185.16 |
| 5,663,903 A | * | 9/1997 | Guo | 365/104 |
| 5,812,440 A | * | 9/1998 | Suminaga et al. | 365/51 |
| 5,825,683 A | * | 10/1998 | Chang | 365/104 |
| 5,875,128 A | * | 2/1999 | Ishizuka | 365/185.06 |
| 6,084,794 A | * | 7/2000 | Lu et al. | 365/104 |

* cited by examiner

Primary Examiner—Son Mai
(74) Attorney, Agent, or Firm—Rabin & Berdo, PC

(57) ABSTRACT

A virtual ground memory with low and fixed pre-charge loading is provided. First metal lines GL(n−1), GL(n), and GL(n+1) and second metal lines BL(n−1) and BL(n) are disposed in the sequence GL(n−1), BL(n−1), GL(n), BL(n) and GL(n+1). Each first metal line and the adjacent second metal line are coupled respectively to two ends of the corresponding memory cell. Word lines are used for controlling memory cells. The second metal lines BL are in high level when the memory cells which the second metal lines BL are coupled to are chosen. A first and second sense amplifier are coupled to the second metal line BL(n−1) and BL(n) respectively, and the first metal lines GL(n−1) and GL(n+1) are coupled to ground level. One of the word lines is enabled to read the corresponding memory cells. A virtual ground memory loading can be fixed by this invention.

9 Claims, 4 Drawing Sheets

MEMORY WITH LOW AND FIXED PRE-CHARGE LOADING

BACKGROUND OF THE INVENTION

1. Field of the Invention

The invention relates in general to virtual ground memory and more particularly to a memory with low pre-charge loading.

2. Description of the Related Art

Referring to FIG. 1, a conventional virtual ground memory 100 is shown. The conventional virtual ground memory 100 includes a number of memory cells M, a number of metal lines MBL, a number of word lines WL, and a number of select lines BO and BE. Two adjacent metal lines are coupled to two ends of the corresponding memory cell, and the word lines are used for controlling the memory cells.

When a memory cell, for example M71, is to be read, sense amplifier SA1 is coupled to the metal line MBL3 and the metal lines MBL4 is coupled to a ground level. After word line WL1 and select lines BO2 and BE2 are enabled and transistors BSO4 and BSE4 are turned on, the sense amplifier SA charges the end A of memory cell M71 to a high voltage and current I is generated to flow through memory cell M71. Since low current flows through the memory cell with high threshold voltage which stores data 0 and large current flows through the memory cell with low threshold voltage which stores data 1 when a high voltage is applied across the memory cell, the sense amplifier SA read the data stored in memory cell M71 by sensing the amount of current I.

When the word line WL1 is enabled, the memory cells in the same row that are controlled by word line WL1 are all turned on. In order to accelerate the sense amplifier SA to charge the end A of memory cell M71 to the high voltage, pre-charge units are applied to pre-charge all of the memory cells in the left side of the memory cell M71 to the high voltage. Because the amount of memory cells that should be pre-charged is quite large, it is necessary to use at least two pre-charge units PC1 and PC2 to perform pre-charge operation. The metal MBL1 coupled to pre-charge unit PC1 is regarded as a shield of the sense amplifier SA to almost isolate the memory cells in the left side of the metal line MBL1 from the sense amplifier SA. Namely, memory cells in the right side of metal line MBL3 are charged by sense amplifier SA, memory cells between the metal lines MBL2 and MBL3 are charged by sense amplifier SA and pre-charge unit PC2, and memory cells in the left side of metal line MBL1 are charged by pre-charge unit PC2 instead of sense amplifier SA. Therefore, the rate of charging the end A of memory cell M71 to the high voltage by the sense amplifier SA is increased.

However, most of the metal lines in the left side of the metal line MBL1 coupled to pre-charge PC1 are floating, that is, virtual grounded, which conduce a large effective capacitive loading. Moreover, the effective capacitive loading of the pre-charge unit PC1 varies with the position of the memory cell which is to be read. Therefore, pre-charge unit PC1 and PC2 consume extra power to perform pre-charging, and the amount of capacitive loading is also difficult to control.

SUMMARY OF THE INVENTION

It is therefore an object of the invention to provide a virtual ground memory to avoid the problem conduced by the large effective capacitive loading. Reduced power consumption is thus achieved according to the invention, and the number of pre-charge units needed in the invention is less than that in the conventional memory. Besides, the body effect of the memory cell which is to be read can be diminished.

The invention achieves the above-identified objects by providing a memory including a number of memory cells, a number of first metal lines, a number of second metal lines, and a number of word lines. The first metal lines at least including first metal lines GL(n−1), GL(n), and GL(n+1) and the second metal lines at least including second metal lines BL(n−1) and BL(n). The first metal lines GL(n−1), GL(n), and GL(n+1) and the second metal lines BL (n−1) and BL (n) are disposed in the sequence GL(n−1), BL(n−1), GL(n), BL(n) and GL(n+1). Each first metal line and the adjacent second metal line are coupled respectively to two ends of the corresponding memory cell. The word lines are used for controlling the memory cells. The second metal lines BL are in high level when the memory cells which the second metal lines BL are coupled to are chosen. A first sense amplifier is coupled to the second metal line BL(n−1), a second sense amplifier is coupled to the second metal line BL(n), the first metal lines GL(n−1) and GL(n+1) are coupled to ground level, and one of the word lines is enabled to read the corresponding memory cells.

Other objects, features, and advantages of the invention will become apparent from the following detailed description of the preferred but non-limiting embodiments. The following description is made with reference to the accompanying drawings.

DETAILED DESCRIPTION OF THE INVENTION

Embodiment One

Figure 2:
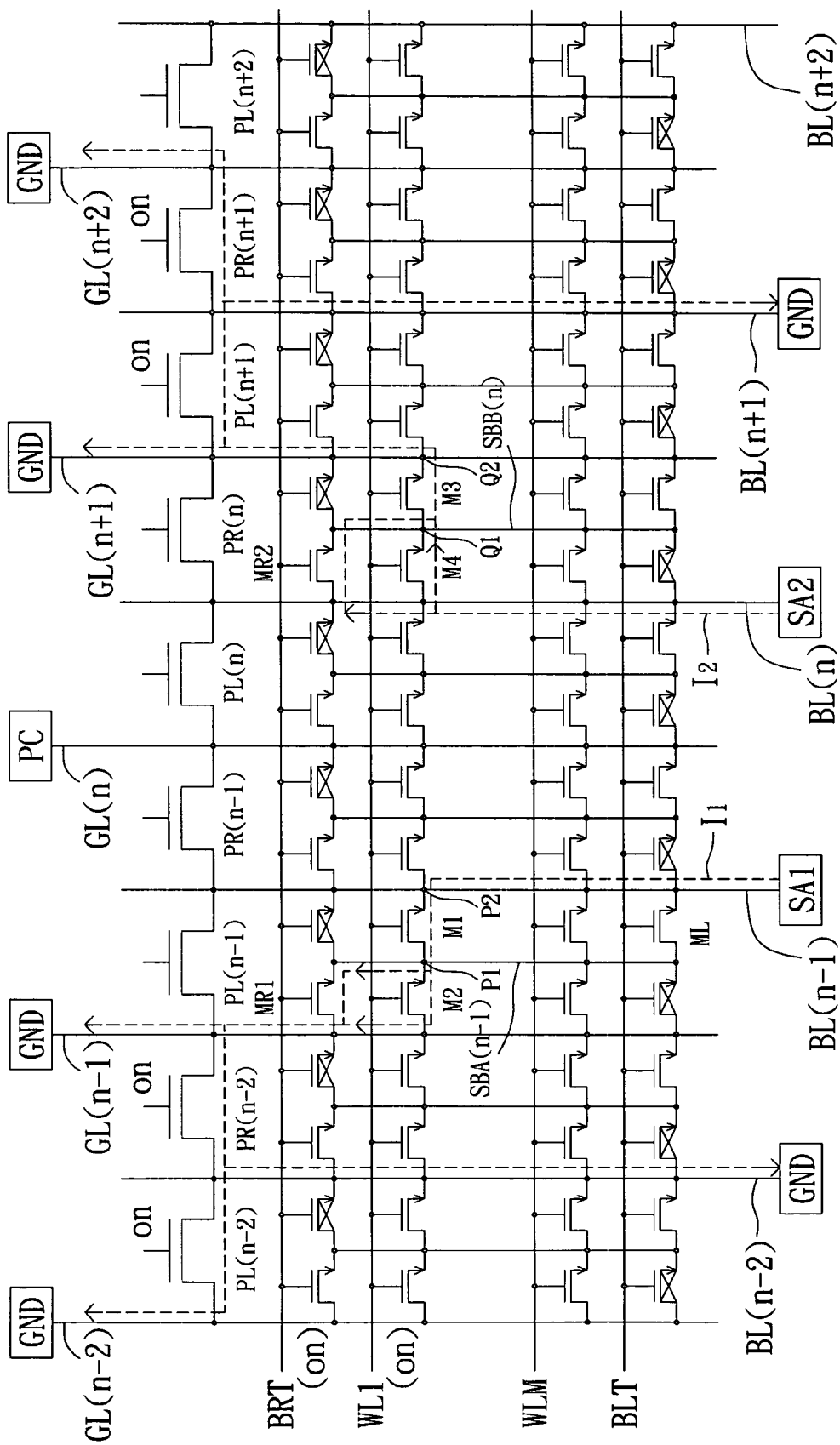
FIG. 2 illustrates a virtual ground memory the first embodiment according to the invention.

Referring to FIG. 2, a virtual ground memory of the first embodiment according to the invention is illustrated. The virtual ground memory 200 includes a number of memory cells, for example, memory cell M1 and memory cell M3 and further includes a number of first metal lines GL, second metal lines BL, and a number of word lines WL. Take first metal lines GL(n−2), GL(n−1), GL(n), GL(n+1), and GL(n+2) and second metal lines BL(n−2), BL(n−1), BL(n), BL(n+1), and BL(n+2) for example to describe the virtual ground memory 100 according to the first embodiment.

The second metal lines BL(n−2), BL(n−1), BL(n), BL(n+1), BL(n+2) are parallel to the first metal lines GL(n−2), GL(n−1), GL(n), GL(n+1), GL(n+2). First metal lines GL(n−2), GL(n−1), GL(n), GL(n+1), and GL(n+2) and the second metal lines BL(n−2), BL(n−1), BL(n), BL(n+1), BL(n+2) are disposed alternately, for example, in the sequence GL(n−2), BL(n−2), GL(n−1), BL(n−1), GL(n), BL(n), GL(n+1), BL(n+1), GL(n+2), and BL(n+2). Each first metal line and an adjacent second metal line are coupled to two ends of two corresponding memory cells. For example, the first metal line GL(n+1) and the adjacent second metal line BL(n) are coupled respectively to one end of the memory cell M3 and one end of the memory cell M4, and the first metal line GL(n−1) and the adjacent second metal line BL(n−1) are coupled respectively to one end of the memory cell M2 and one end of the memory cell M1. The word lines are used for controlling the memory cells. For example, memory cells M1, M2, M3 and M4 are controlled by the word line WL1.

The virtual ground memory 200 further includes a right bank select line BRT, a left bank select line BLT, a number of sub-metal lines SBA and SBB, and a number of right bank select cells MR and left bank select cells ML. The other ends of memory cells M3 and M4 are coupled to the sub-metal line SBB(n), while the other ends of memory cells M1 and M2 are coupled to a sub-metal line SBA(n−1). The right bank select cells MR are controlled by the right bank select line BRT, and the left bank select cells ML are controlled by the left bank select line BLT. One ends of the right and left bank select cells MR and ML are coupled to the corresponding sub-metal line SBA or SBB, while the other ends of the right and left bank select cells are coupled to the corresponding first or second metal lines. For example, one end of the right bank select cell MR1 and one end of the right bank select cell MR2 are coupled to the sub-metal line SBA(n−1) and SBB(n) respectively. The other end of the right bank select cell MR1 is coupled to the first metal lines GL(n−1), and the other end of the right bank select cell MR2 is coupled to the second metal lines BL(n).

When decoding the memory array, two sense amplifiers are applied to selectively read both data bits from any two memory cells simultaneously. Take memory cells M1 and M3 for example. When memory cell M3 and M1 are to be read, first and second sense amplifiers SA1 and SA2 are coupled to the second metal lines BL(n−1) and BL(n) respectively while the first metal lines GL(n−1) and GL(n+1) are coupled to ground level. That is, the second metal lines BL(n−1) and BL(n) are in high level by the first and second sense amplifiers SA1 and SA2 when the memory cells M1 and M3 which the second metal lines BL(n−1) and BL(n) are coupled to are chosen. Besides, the right bank select line BRT is enabled so as to turning on the right bank select cells MR1, and MR2. Memory cells M3 and M1 can then be read by enabling word line WL1 that controls them.

When reading memory cells M3 and M1, the second metal line BL(n−1) coupled to the sense amplifier SA1 serves as a shield of the sense amplifier SA2 while the second metal line BL(n) coupled to the sense amplifier SA2 serves as a shield of the sense amplifier SA1. When reading memory cell M1, the first end P1 of the memory cell M1 is coupled to ground level through the first metal line GL(n−1), and the memory cells next to the memory cell M1 and coupled to the second end P2 of the memory cell M1 should be charged to a high voltage. Similarly, when reading memory cells M3, the first end Q1 of the memory cell M3 is coupled to ground level through the first metal line GL(n+1), and the memory cell on the left side of the second end Q2 of the memory cell M3 should be charged to the high voltage. In this way, the memory cells on the right side of the first end Q1 and those on the left side of the first end P1 are not necessary to be charged to the high voltage because the first ends P1 and Q1 are grounded. Conversely, only memory cells between the second metal lines BL(n−1) and BL(n) which are coupled to the sense amplifiers SA1 and SA2 respectively are necessary to be charged to the high voltage. Therefore, a rapid charging rate at which the memory cells between second metal lines BL(n−1) and BL(n), that is, between memory cells M1 and M3, are charged to the high voltage by the sense amplifiers SA1 and SA2 can be achieved.

When the memory cell M1 is being read, currents I1 flow from the sense amplifier SA1, through the memory cell M1, and then toward the ground level. Similarly, the current I2 flows from the sense amplifier SA2, through the memory cell M3, and then toward the ground level. The sense amplifiers SA1 and SA2 read the data stored in memory cells M1 and M3 by sensing the amount of currents I1 and I2 respectively.

In order to increase the rate of charging the memory cells between second metal lines BL(n−1) and BL(n), a pre-charge unit PC is coupled to the first metal line GL(n) to apply a high voltage when the memory cells M1 and M3 are to be read. Therefore, the data stored in the memory cells M1 and M3 can be read out more quickly.

The characteristics of memory cells M1 and M3 can be further improved by using pass gates which connect the first metal lines and the adjacent second metal lines. Take pass gates PL(n−2), PR(n−2), PL(n−1), PR(n−1), PL(n), PR(n), PL(n+1), and PR(n+1) for example. Pass gates PL(n−2) are coupled between the first metal line G(n−2) and the second metal line BL(n−2), and the pass gates PR(n−2) are coupled between the second metal line BL(n−2) and the first metal line GL(n−1). The pass gates PL(n−1) are coupled between the first metal line GL(n−1) and the second metal line BL(n−1), and the pass gates PR(n−1) are coupled between the second metal line BL(n−1) and the first metal line GL(n). The pass gates PL(n) are coupled between the first metal line GL(n) and the second metal line BL(n), and the pass gates PR(n) are coupled between the second metal line BL(n) and the first metal line GL(n+1). The pass gates PL(n+1) are coupled between the first metal line GL(n+1) and the second metal line BL(n+1), and the pass gates PR(n+1) are coupled between the second metal line BL(n+1) and the first metal line GL(n+2).

When memory cells M1 and M3 are to be read, the pass gates PL(n−2), PR(n−2), PL(n+1), and PR(n+1) are turned on, and the first metal lines GL(n−2), GL(n+2) and the second metal lines BL(n−2), BL(n+1) are coupled to ground level. In this way, the first current I1 from the first sense amplifier SA1 flows through the second metal line BL(n−1), the memory cells M1 and M2, the right bank select cell MR1, and first metal lines GL(n−1) and GL(n−2) and the second metal line BL(n−2). While the second current I2 from the second sense amplifier SA2 flows through the second metal line BL(n), the right bank select cell MR4, the memory cells M3 and M4, and first metal lines GL(n+1), GL(n+2) and the second metal line BL(n+1). Since the first metal lines GL(n−2), GL(n−1) and the second metal line BL(n−2) provide three current paths for the current I1 to flow through to the ground, the effective resistance at the first end P1 of the memory cell M1 is reduced, thereby diminishing the body effect of the memory cell M1 and improving the characteristics of the memory cell M1. Similarly, since the first metal lines GL(n+1), GL(n+2) and the second metal line BL(n+1) provide three current paths for the current I2 to flow through to the ground, thereby diminishing the body effect of the memory cell M3 and improving the characteristics of the memory cell M3.

Figure 1:
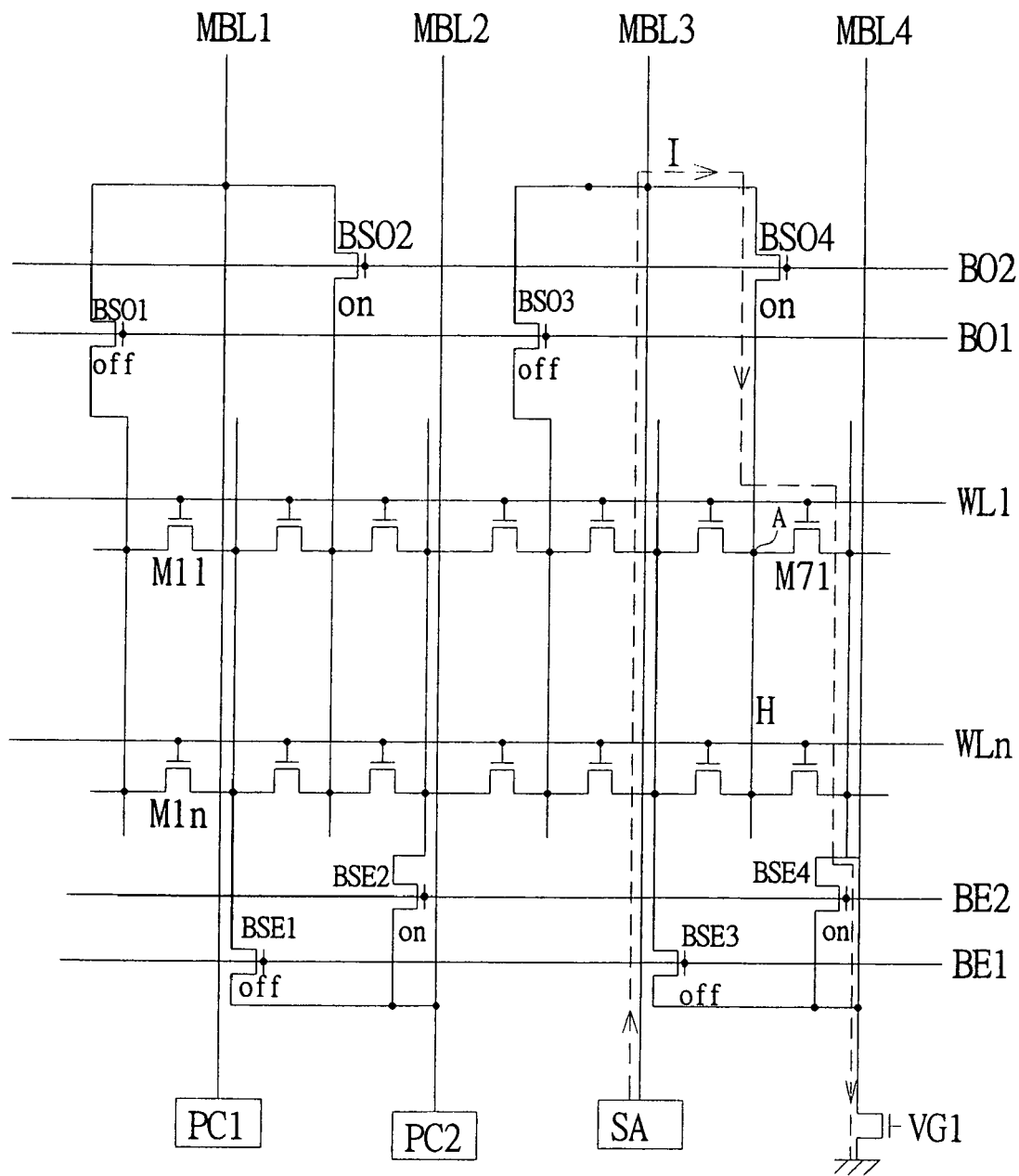
FIG. 1 shows a conventional virtual ground memory

The second metal lines BL(n) coupled to sense amplifier SA2 can provide a shield to sense amplifier SA1, and the effective capacitive loading of sense amplifier SA1 is reduced and the power for pre-charging the memory cells between second metal line BL(n−1) and BL(n) are saved. Similarly, the effective capacitive loading of sense amplifier SA2 is reduced. Besides, when pre-charge unit PC is coupled to second metal line GL(n), the effective capacitive loading of the pre-charge unit PC is considerably decreased, and the power consumption of the pre-charge PC is considerably reduced compared with that of the pre-charge units PC1 and PC2 in the conventional virtual ground memory 100 in FIG. 1. Furthermore, one pre-charge unit PC is enough to perform pre-charging, thus reducing the cost of manufacturing of virtual ground memory 200.

Embodiment Two

Figure 3:
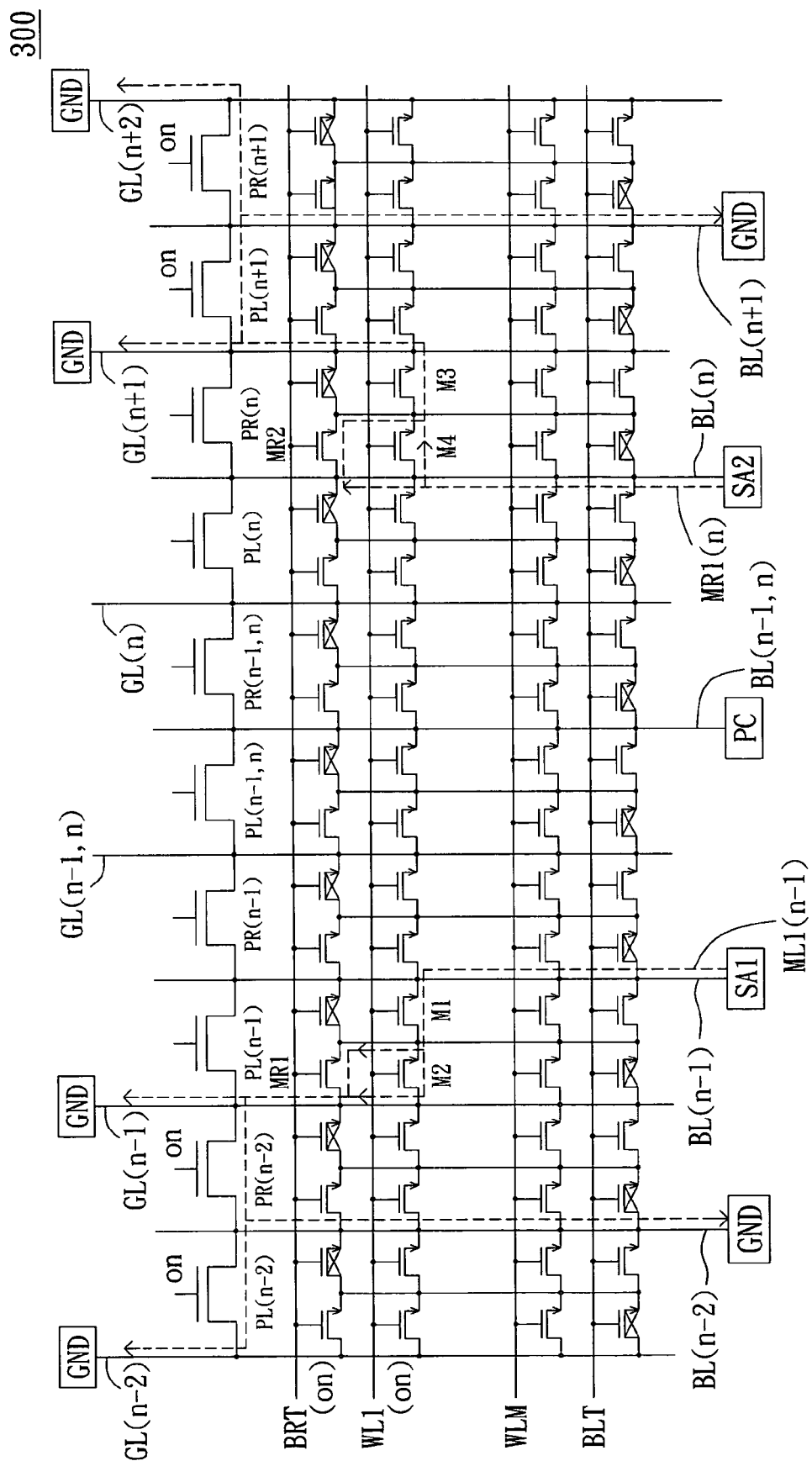
FIG. 3 illustrates a virtual ground memory with three metal lines disposed between the sense-amplifier-coupled metal lines according to the second embodiment according to the invention.

One or more metal lines can be disposed between the metal lines coupled to sense amplifiers SA1 and SA2. As an example, a virtual ground memory 300 is illustrated with three metal lines disposed between the sense-amplifier-coupled metal lines in FIG. 3, according to the second embodiment according to the invention. The virtual ground memory 300 further includes a second metal line BL(n−1, n), a second metal line GL(n−1, n), and pass gates PL(n−1, n) and PR(n−1, n). The second metal line BL(n−1, n) and the first metal line GL(n−1, n) are disposed between the second metal line BL(n−1), and the second metal line BL(n−1, n) is disposed between the first metal line GL(n−1, n). Pre-charge unit PC is preferably coupled to the second metal line BL(n−1, n) when the memory cells M1 and M3 are to be read.

Embodiment Three

Figure 4:
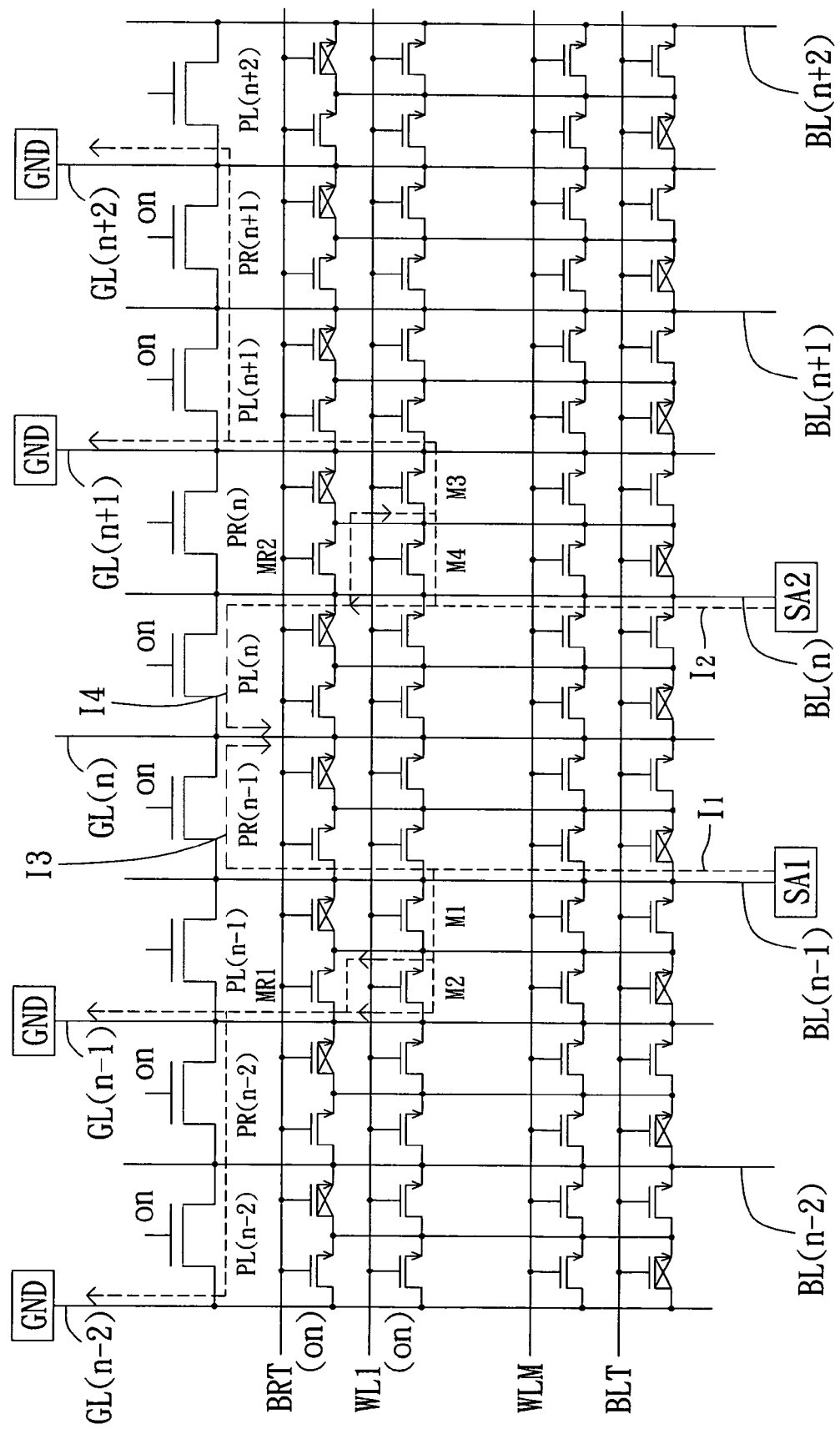
FIG. 4 illustrates a virtual ground memory of the third embodiment according to the invention.

Referring to FIG. 4, a ROM of the third embodiment according to the invention is illustrated. The difference between the virtual ground memory 400 in FIG. 4 and the virtual ground memory 200 in FIG. 2 is that the pre-charge unit PC is no longer needed in the virtual ground memory 400 and the pass gates PR(n−1) and PL(n) are enabled when the memory cells M1 and M3 are to be read in pre-charging action. Due to the turned on pass gates PR(n−1) and PL(n), part of the current I3 and I4 output from the sense amplifiers SA1 and SA2 are injected into second metal line GL(n). Thus, the pre-charging is performed by sense amplifier SA1 and SA2. The virtual ground memory 300 and 400 of the second and third embodiments have the advantages as the virtual ground memory 200 of the first embodiment has. Similarly, the pre-charge unit PC is no longer needed in the virtual ground memory 300 in FIG. 3 if the pass gates PR(n−1), PL(n−1,n), PR(n−1,n), and PL(n) are turned on when the memory cell M1 and M3 are to be read.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A virtual ground memory comprising:
a plurality of memory cells;
a plurality of first metal lines at least including first metal lines GL(n−1), GL(n), and GL(n+1) and a plurality of second metal lines at least including second metal lines BL(n−1) and BL(n), the first metal lines GL(n−1), GL(n), and GL(n+1) and the second metal lines BL(n−1) and BL(n) are disposed in the sequence GL(n−1), BL(n−1), GL(n), BL(n) and GL(n+1), each first metal line and the adjacent second metal line are coupled respectively to two ends of the corresponding memory cells, and the second metal lines BL are in high level when the memory cells which the second metal lines BL are coupled to are chosen; and
a plurality of word lines, for controlling the memory cells;
wherein a first sense amplifier is coupled to the second metal line BL(n−1), a second sense amplifier is coupled to the second metal line BL(n), and the first metal lines GL(n−1) and GL(n+1) are coupled to ground level, and one of the word lines is enabled to read the corresponding memory cells.

2. The virtual ground memory according to claim 1, wherein the virtual ground memory further comprises:
first metal lines GL(n−2) and GL(n+2);
second metal lines BL(n−2), BL(n+1), the second metal lines BL(n−2) being disposed between the first metal lines GL(n−2) and GL(n−1), and the second metal lines BL(n+1) being disposed between the first metal lines GL(n+1) and GL(n+2); and
a plurality of pass gates including pass gates PL(n−2), PR(n−2), PL(n+1), and PR(n+1), the pass gates PL(n−2) is coupled between the first metal line G(n−1) and the second metal line BL(n−2), and the pass gate PR(n−2) is coupled between the second metal line BL(n−2) and the first metal line GL(n−1), the pass gate PL(n+1) is coupled between the first metal line G(n+1) and the second metal line BL(n+1), and the pass gate PR(n+1) is coupled between the second metal line BL(n+1) and the first metal line GL(n+2);
wherein when the corresponding memory cells are to be read, the pass gates PL(n−2), PR(n−2), PL(n+1), and PR(n+1) are turned on, and the first metal lines GL(n−2), GL(n+2) and second metal lines BL(n−2), BL(n+1) are coupled to ground level, the first sense amplifier outputs a first current flowing through the second metal lines BL(n−1), BL(n−2) and first metal lines GL(n−1) and GL(n−2), and the second sense amplifier outputs a second current flowing through the second metal lines BL(n), BL(n+1) and first metal lines GL(n+1) and GL(n+2).

3. The virtual ground memory according to claim 2, wherein a pre-charge unit PC is coupled to the first metal line GL(n) to apply a high voltage when the corresponding memory cells are to be read.

4. The virtual ground memory according to claim 2, wherein the virtual ground memory further comprises a second metal line BL(n−1, n) and a first metal line GL(n−1, n) which are disposed between the second metal line BL(n−1) and the first metal line GL(n), the second metal line BL(n−1, n) is disposed between the first metal line GL(n−1, n) and the first metal line GL(n), and a pre-charge unit PC is coupled to the second metal line BL(n−1, n) when the corresponding memory cells are to be read.

5. The virtual ground memory according to claim 2, wherein the virtual ground memory further comprises pass gates PL(n−1,n) and PR(n−1,n), the pass gate PL(n−1,n) is coupled between the first metal line GL(n−1,n) and the second metal line BL(n−1,n), the pass gate PR(n−1,n) is coupled between the first metal line GL(n) and the second metal line BL(n−1,n), and the pass gates PR(n−1), PL(n−1, n), PR(n−1,n), and PL(n) are turned on in pre-charging action when the corresponding memory cells are to be read.

6. The virtual ground memory according to claim 2, wherein the virtual ground memory further comprises pass gates PR(n−1) and PL(n), the pass gate PR(n−1) is coupled between the first metal line GL(n) and the second metal line BL(n−1), the pass gate PL(n) is coupled between the first metal line GL(n) and the second metal line BL(n), and the pass gates PR(n−1) and PL(n) are turned on in pre-charging action when the corresponding memory cells are to be read.

7. The virtual ground memory according to claim 1, wherein a pre-charge unit PC is coupled to the first metal line GL(n) to apply a high voltage when the corresponding memory cells are to be read.

8. The virtual ground memory according to claim 1, wherein the virtual ground memory further comprises a second metal line BL(n−1, n), a first metal line GL(n−1, n), and a pre-charge unit PC is coupled to the second metal line BL(n−1, n) when the corresponding memory cells are to be read.

9. The virtual ground memory according to claim 1, wherein the virtual ground memory further comprises pass gates PR(n−1) and PL(n), the pass gate PR(n−1) is coupled between the first metal line GL(n) and the second metal line BL(n−1), the pass gate PL(n) is coupled between the first metal line GL(n) and the second metal line BL(n), and the pass gates PR(n−1) and PL(n) are turned on in pre-charging action when the corresponding memory cells are to be read.

* * * * *